(12) United States Patent
Liu et al.

(10) Patent No.: US 10,854,259 B2
(45) Date of Patent: Dec. 1, 2020

(54) ASYNCHRONOUS READ CIRCUIT USING DELAY SENSING IN MAGNETORESISTIVE RANDOM ACCESS MEMORY (MRAM)

(71) Applicant: Taiwan Semiconductor Manufacturing Co., Ltd., Hsin-Chu (TW)

(72) Inventors: Jack Liu, Taipei (TW); Charles Chew-Yuen Young, Cupertino, CA (US)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/381,365

(22) Filed: Apr. 11, 2019

(65) Prior Publication Data

US 2020/0005846 A1    Jan. 2, 2020

Related U.S. Application Data

(60) Provisional application No. 62/692,213, filed on Jun. 29, 2018.

(51) Int. Cl.
*G11C 11/16*  (2006.01)
*H01F 10/32*  (2006.01)
*H01L 43/02*  (2006.01)
*H01L 27/22*  (2006.01)

(52) U.S. Cl.
CPC ........ *G11C 11/1673* (2013.01); *G11C 11/161* (2013.01); *G11C 11/1693* (2013.01); *H01F 10/3254* (2013.01); *H01L 27/228* (2013.01); *H01L 43/02* (2013.01)

(58) Field of Classification Search
CPC ............................ G11C 11/15; G11C 11/1673
USPC .......................................................... 365/158
See application file for complete search history.

(56) References Cited

U.S. PATENT DOCUMENTS

2011/0291761 A1* 12/2011 Rao .................... G11C 11/1673
                                                              330/277

* cited by examiner

Primary Examiner — Anthan Tran
(74) Attorney, Agent, or Firm — Eschweiler & Potashnik, LLC

(57) ABSTRACT

Some embodiments of the present disclosure relate to a memory device. The memory device includes an active current path including a magnetic tunnel junction (MTJ); and a reference current path including a reference resistance element. The reference resistance element has a resistance that differs from a resistance of the MTJ. An asynchronous, delay-sensing element has a first input coupled to the active current path and a second input coupled to the reference current path. The asynchronous, delay-sensing element is configured to sense a timing delay between a first rising or falling edge voltage on the active current path and a second rising or falling edge voltage on the reference current path. The asynchronous, delay-sensing element is further configured to determine a data state stored in the MTJ based on the timing delay.

20 Claims, 8 Drawing Sheets

ASYNCHRONOUS READ CIRCUIT USING DELAY SENSING IN MAGNETORESISTIVE RANDOM ACCESS MEMORY (MRAM)

REFERENCE TO RELATED APPLICATION

This Application claims the benefit of U.S. Provisional Application No. 62/692,213, filed on Jun. 29, 2018, the contents of which are hereby incorporated by reference in their entirety.

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Magnetic tunnel junctions (MTJs) can be used in hard disk drives and/or RAM, and thus are promising candidates for next generation memory solutions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
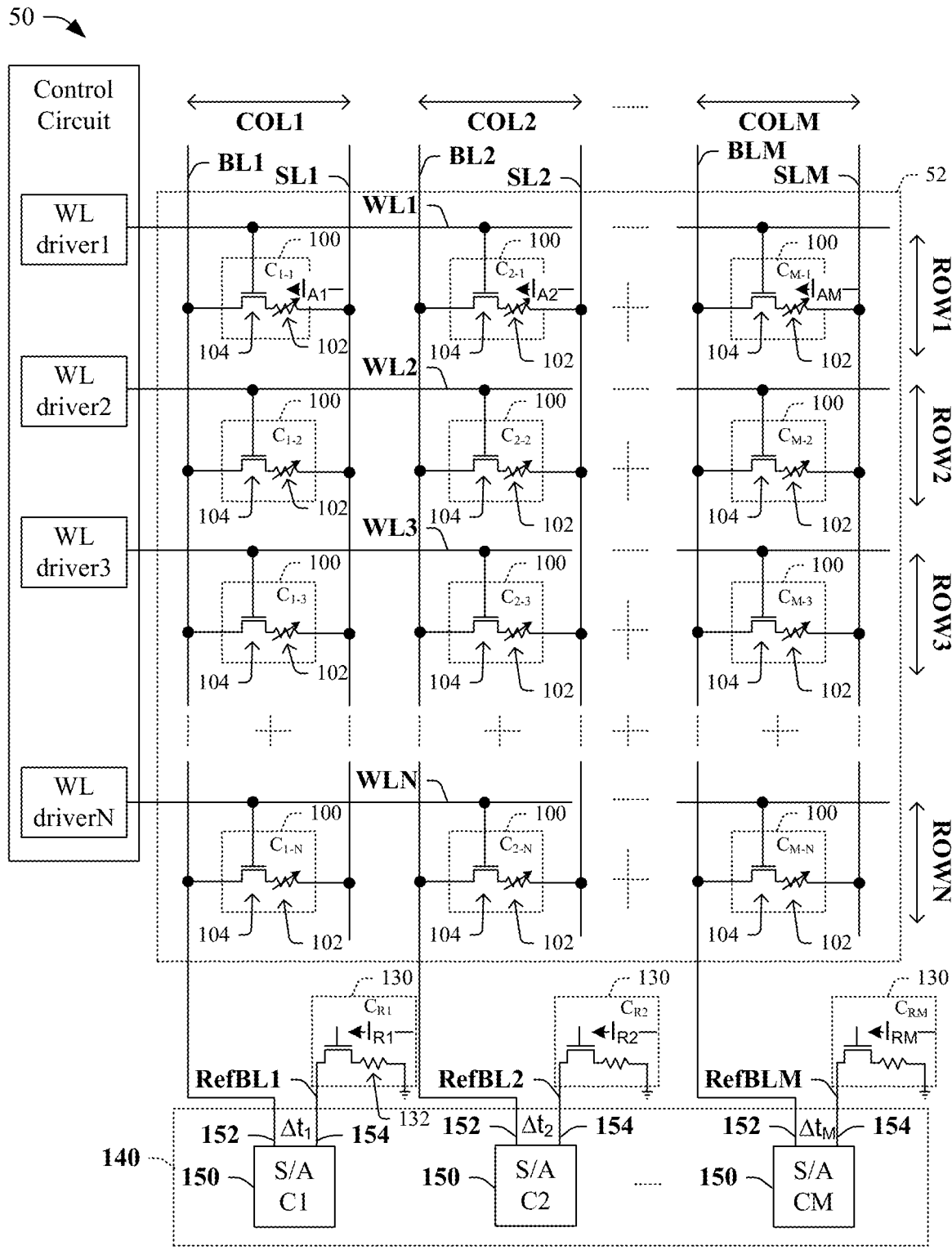
FIG. 1 illustrates a diagram depicting some embodiments of a memory device including an array of MTJ memory cells and associated read circuitry.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) includes first and second ferromagnetic films separated by a tunnel barrier layer. One of the ferromagnetic films (often referred to as a "reference layer") has a fixed magnetization direction, while the other ferromagnetic film (often referred to as a "free layer") has a variable magnetization direction. If the magnetization directions of the reference layer and free layer are in a parallel orientation, it is more likely that electrons will tunnel through the tunnel barrier layer, such that the MTJ is in a low-resistance state. Conversely, if the magnetization directions of the reference layer and free layer are in an anti-parallel orientation, it is less likely that electrons will tunnel through the tunnel barrier layer, such that the MTJ is in a high-resistance state. Consequently, the MTJ can be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel).

Because of their binary nature, MTJs are used in memory cells to store digital data, with the low resistance state $R_P$ corresponding to a first data state (e.g., logical "0"), and the high-resistance state $R_{AP}$ corresponding to a second data state (e.g., logical "1"). To read data from such an MTJ memory cell, the MTJ's resistance $R_{MTJ}$ (which can vary between $R_P$ and $R_{AP}$, depending on the data state that is stored) can be compared to a reference MTJ's resistance, $R_{Ref}$ (where $R_{Ref}$, for example, is between $R_P$ and $R_{AP}$). In some approaches, this difference in resistance can be measured by using voltage sensing in which equal currents are applied to the MTJ and the reference resistance to develop a voltage difference $\Delta V$ there between. A sense amplifier can then amplify the voltage difference $\Delta V$ to full rail voltage to determine whether a data state read from the MTJ is a "0" or "1". However, when the read current is small, it is difficult to generate a large enough voltage difference $\Delta V$ for the sense amplifier to quickly and accurately determine whether a "0" or "1" state is stored. Although read current levels could be increased, a larger read current can cause the data state stored in the MTJ memory cell to inadvertently "flip"

before or during the read operation—an undesirable condition known as "read disturb".

Accordingly, rather than using voltage sensing, the present disclosure provides techniques for reading MTJ memory cells which make use of a timing delay difference between a first rising or falling edge of a voltage signal from the MTJ and a second rising or falling edge of a voltage signal from the reference resistance. In this approach, the read current is dynamic in that it peaks and tapers off during the read cycle. The maximum or peak read current can be larger than previous approaches (better $\Delta V$ & $\Delta I$), but the average read current is small enough to not cause read disturb. Thus, by sensing the delay difference between signals from the MTJ and reference resistance, this approach enables more robust sensing.

FIG. 1 illustrates a memory device 50 that includes a number of memory cells 100 arranged in a memory array 52. Each memory cell 100 includes an MTJ memory element 102 and an access transistor 104. Within the memory array 52, the memory cells 100 are arranged in M columns (bits) and N rows (words), and are labeled $C_{ROW\text{-}COLUMN}$ in FIG. 1. Word-lines (WL) extend along respective rows, and are coupled to gate electrodes of the access transistors 104 along the respective rows. Active bit-lines (BL) and active source-lines (SL) extend along respective columns. For each column, the BL is coupled to one side of the MTJ memory elements 102 along that column, and the SL is coupled to the opposite side of the MTJ memory elements 102 along that column through the access transistors 104.

For example, in Row 1 of the memory device 50, the cells $C_{1\text{-}1}$ through $C_{M\text{-}1}$ form an M-bit data word accessible by activation of word-line WL1. Thus, when WL1 is activated, data states can be written to or read from the respective cells $C_{1\text{-}1}$ through $C_{M\text{-}1}$ through active bit-lines $BL_1$ through $BL_M$ and/or by active source-lines $SL_1$ through $SL_M$, respectively.

During a typical write operation to Row 1, a voltage $V_{WL}$ is applied to a word-line $WL_1$, wherein the $V_{WL}$ is typically greater than or equal to a threshold voltage of the access transistors 104, thereby turning on the access transistors within Row 1 and coupling the active bit-lines $BL_1$ through $BL_M$ to the MTJ memory elements 102 in the accessed memory cells (e.g., memory cells $C_{1\text{-}1}$ through $C_{1\text{-}M}$, respectively). Suitable biases are applied across the active bit-lines $BL_1$ through $BL_M$ and their corresponding active source-lines $SL_1$ through $SL_M$, where the bias between each active bit-line and source-line for a column is representative of a data value to be written to the accessed memory cell of that column. While Row 1 is accessed, the word-lines of the other rows ($WL_2$-$WL_N$) remain off (e.g., less than threshold voltage of the access transistors), such that the MTJ memory elements of the other cells remain isolated and are not written to or read from even though active bit-lines $BL_1$ through $BL_M$ and active source-lines $SL_i$ through $SL_M$ are biased. Other rows can be written to in similar fashion.

For read operations, an asynchronous read circuit 140, which can include a sense amplifier (S/A) 150 for each column, is used to detect stored data states from accessed memory cells of the columns. During a typical read operation of Row 1, voltage $V_{WL}$ is again applied to word-line $WL_1$ to turn on the access transistors 104 and couple the active bit-lines $BL_1$ through $BL_M$ to the MTJ memory elements 102 of the accessed cells ($C_{1\text{-}1}$ through $C_{M\text{-}1}$, respectively). The sense amplifiers 150 then induce equal active read currents ($I_{A1}$-$I_{AM}$) though the accessed MTJ memory elements 102 via their respective active bitlines $BL_1$ through $BL_M$ and active source-lines $SL_1$ through $SL_M$. Because the MTJ memory elements 102 have different resistances (e.g., each can be either $R_P$ or $R_{AP}$ depending on the data states stored therein), these active read currents $I_{A1}$-$I_{AM}$ cause the voltage levels of the respective active bit-lines $BL_1$ through $BL_M$ to differ from one another in time to reflect the data state stored in the respective accessed MTJ memory cells. For example, if memory cell $C_{1\text{-}1}$ is in a high resistance state (e.g., memory element 102 is in state $R_{AP}$), BL1 will tend to give a lower voltage at S/A input 152 for S/A C1; while if cell $C_{2\text{-}1}$ is in a lower resistance state (e.g., memory element 102 in $R_P$), BL2 will tend to give a higher voltage at S/A input 152 for S/A C2.

More particularly, to determine whether the data state read from an accessed MTJ memory element 102 is a "1" or a "0" for a given column, a reference current (e.g., $I_{R1}$ which is equal to the active read current $I_{A1}$) is induced through a reference MTJ cell 130 (e.g., $C_{R1}$) for the column (e.g., Col1). The reference MTJ cell 130 includes a reference resistance element 132 which has a resistance $R_{ref}$ that is between $R_P$ and $R_{AP}$. Thus, a first S/A input terminal (e.g., 152) of each sense amplifier 150 is coupled to the active bit-line of the column (e.g., 152 of S/A C1 150 is coupled to active bit-line $BL_1$) and a second S/A input terminal (e.g., 154) is coupled to a reference bitline of the column (e.g., 154 of S/A C1 150 is coupled to a reference bit-line $REFBL_1$). The voltages on the first and second S/A input terminals 152, 154 have a timing delay difference there between (e.g., $\Delta t_1$, which arises from the resistance difference between the active MTJ cell 100 (e.g., $C_{1\text{-}1}$ is either $R_P$ or $R_{AP}$) and the reference MTJ cell 130 (e.g., $C_{R1}$ is $R_{REF}$). Depending upon the timing delay difference present, the sense amplifier returns a "1" or a "0" for the data state read from that column. For example, if a predetermined voltage arrives on first S/A input terminal 152 before arriving on second S/A input terminal 154, then the sense amplifier returns a "0"; but if the predetermined voltage arrives on first S/A input terminal 152 after arriving on second S/A input terminal 154, then the sense amplifier 150 returns a "1" (or vice versa).

In this scheme, the active read currents $I_{A1}$-$I_{AM}$ are dynamic in that they peak and taper off for each column during the read cycle. The peak read current can be larger than previous approaches, but the average read current is small enough to not cause read disturb. Thus, by sensing the timing delay difference between signals from an active memory cell 100 and a reference MTJ cell 130 (rather than sensing solely a voltage difference or current difference), this approach enables more robust sensing.

Figure 2A:
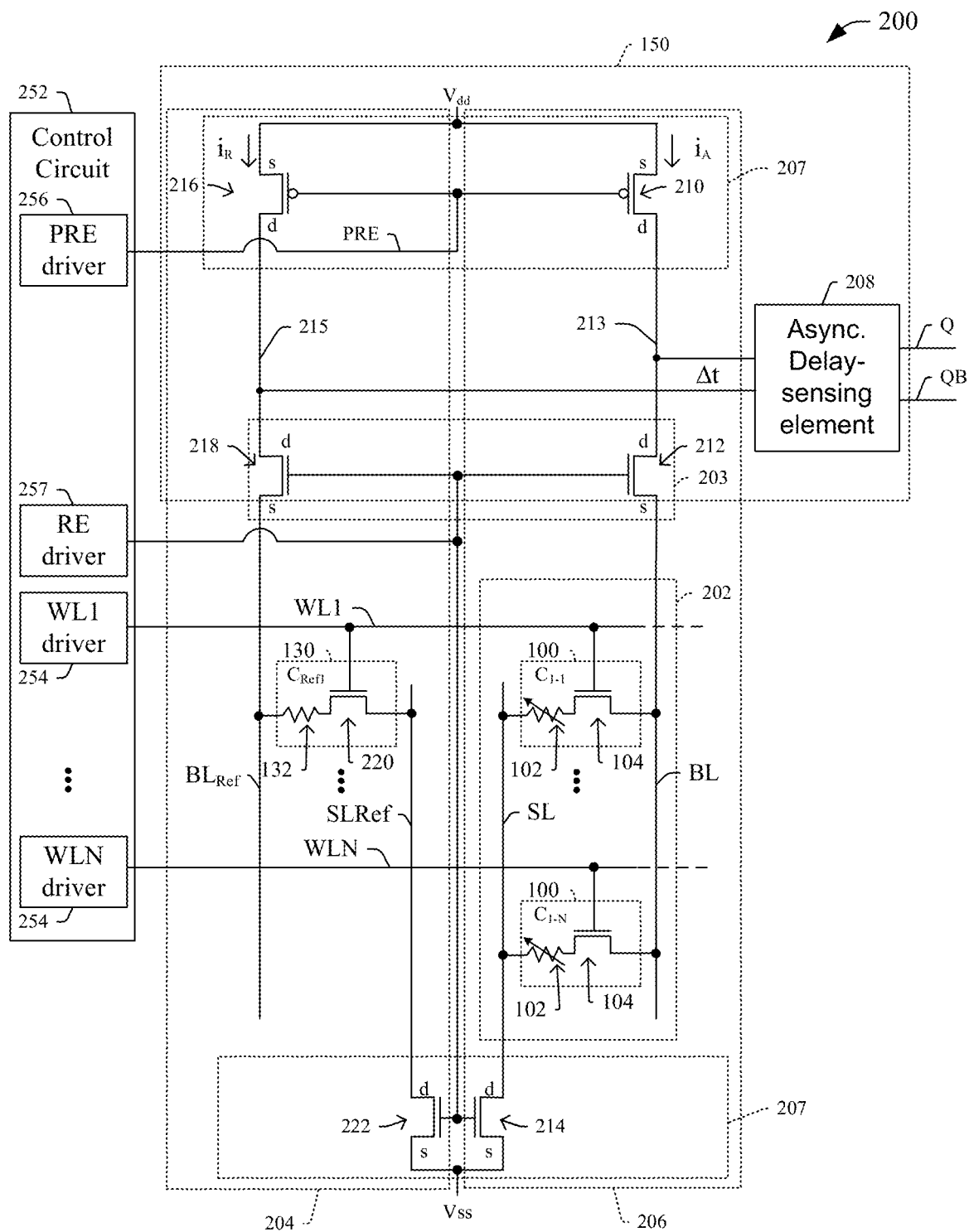
FIG. 2A illustrates a circuit schematic for some embodiments of a data path that can be used in the memory device of FIG. 1.

FIG. 2A illustrates a schematic view of a data path 200 of the memory device 50 in more detail. The data path 200 generally corresponds to a single column of the memory device 50 of FIG. 1, albeit with some additional circuitry which was not depicted in FIG. 1. The data path 200 includes a reference current path 204 and an active current path 206, which are arranged in parallel with one another between $V_{DD}$ and $V_{SS}$. The active current path 206 includes a column 202 of active memory cells that are coupled in parallel between an active bitline (BL) and an active source line (SL), while the reference current path 204 includes one or more reference MTJ cells 130 coupled between a reference bitline $BL_{Ref}$ and a reference sourceline $SL_{Ref}$. A coupling circuit 203 selectively couples the active bitline BL to an active senseline 213, and selectively couples the reference bitline $BL_{Ref}$ to a reference senseline 215. Biasing circuitry 207 is configured to provide a bias over an accessed active memory cell 100 of the column and over a reference MTJ cell 130 when a corresponding WL is activated, typically by providing an active read current ($I_A$) through the accessed memory cell 100 of the column and by providing a reference read current ($I_R$) through the reference MTJ cell 130.

An asynchronous, delay-sensing element 208 is coupled to the active senseline 213 and reference senseline 215, and is configured to determine a data state stored in an accessed active memory cell 100 by evaluating a timing delay $\Delta t$ between a first rising or falling edge voltage on the active senseline 213 and a second rising or falling edge voltage on the reference senseline 215. The asynchronous, delay-sensing element 208 then determines a data state stored in the MTJ memory element 102 of the accessed active memory cell 100 based on the timing delay $\Delta t$. For example, based on the timing delay, the sense amplifier 150 can provide an output voltage on output Q whose voltage level is in one of two states, representing a logical "1" or a logical "0", which was read from the accessed active memory cell 100.

More particularly, the active current path 206 includes a first pre-charge transistor 210, a first pull-up read-enable transistor 212, a column 202 of active MTJ memory cells 100, and a first pull-down read-enable transistor 214. Each MTJ memory element 102 of the column 202 can be switched between a low resistance state (e.g., $R_P$) and a high resistance state (e.g., $R_{AP}$).

The reference current path 204 includes a second pre-charge transistor 216; a second pull-up read-enable transistor 218; the reference MTJ memory cell 100' (including a reference resistance 122, which can be implemented as a resistor with a fixed resistance $R_{Ref}$ in some embodiments, and a second access transistor 220); and a second pull-down read-enable transistor 222. The reference resistance $R_{ref}$ is between $R_P$ and $R_{AP}$, and can for example be an average or midpoint between $R_P$ and $R_{AP}$. A reference bit-line ($BL_{Ref}$) and reference source-line ($SL_{Ref}$), which have lengths and resistances that are substantially equal to those of the BL and SL, are coupled to opposite ends of the reference MTJ cell 130.

A control circuit 252, which includes word-line driver circuits 254, a pre-charge driver circuit 256, and a read-enable (RE) driver circuit 257; provides control signals to the data path to facilitate read and write operations. The word-line driver circuits 254 have outputs coupled to respective word-lines, and the word-lines are coupled to respective gates of the access transistors along a row of memory cells. The pre-charge driver circuit 256 has an output coupled to the gates of transistors 210, 216, and is configured to provide a pre-charge voltage signal PRE during read and write operations. The read enable driver circuit 257 has an output coupled to the gates of transistors 212, 214, 218, and 222, and is configured to provide a read-enable voltage signal RE during read and write operations.

Although FIG. 2A illustrates the data path 200 with p-type and n-type metal oxide semiconductor field effect transistors (MOSFETs), it will be appreciated that in other embodiments one or more of the n-type MOSFETs can be replaced with p-type MOSFETs and/or one or more of the p-type MOSFETs can be replaced with n-type MOSFETs. Further, rather than MOSFETs, other types of switching elements and/or isolation elements can also be used, including but not limited to, bipolar junction transistors (BJTs), fin field effect transistors (FinFETs), junction field effect transistors (JFETs), and diodes. Further, FIG. 2A illustrates a single MTJ reference cell 130 that is shared for all rows of the column 202, but in other embodiments, each row can have its own reference MTJ cell 130 such that the number of reference MTJ cells 130 and the number of rows for each column correspond to one another in one to one fashion.

Figure 2B:
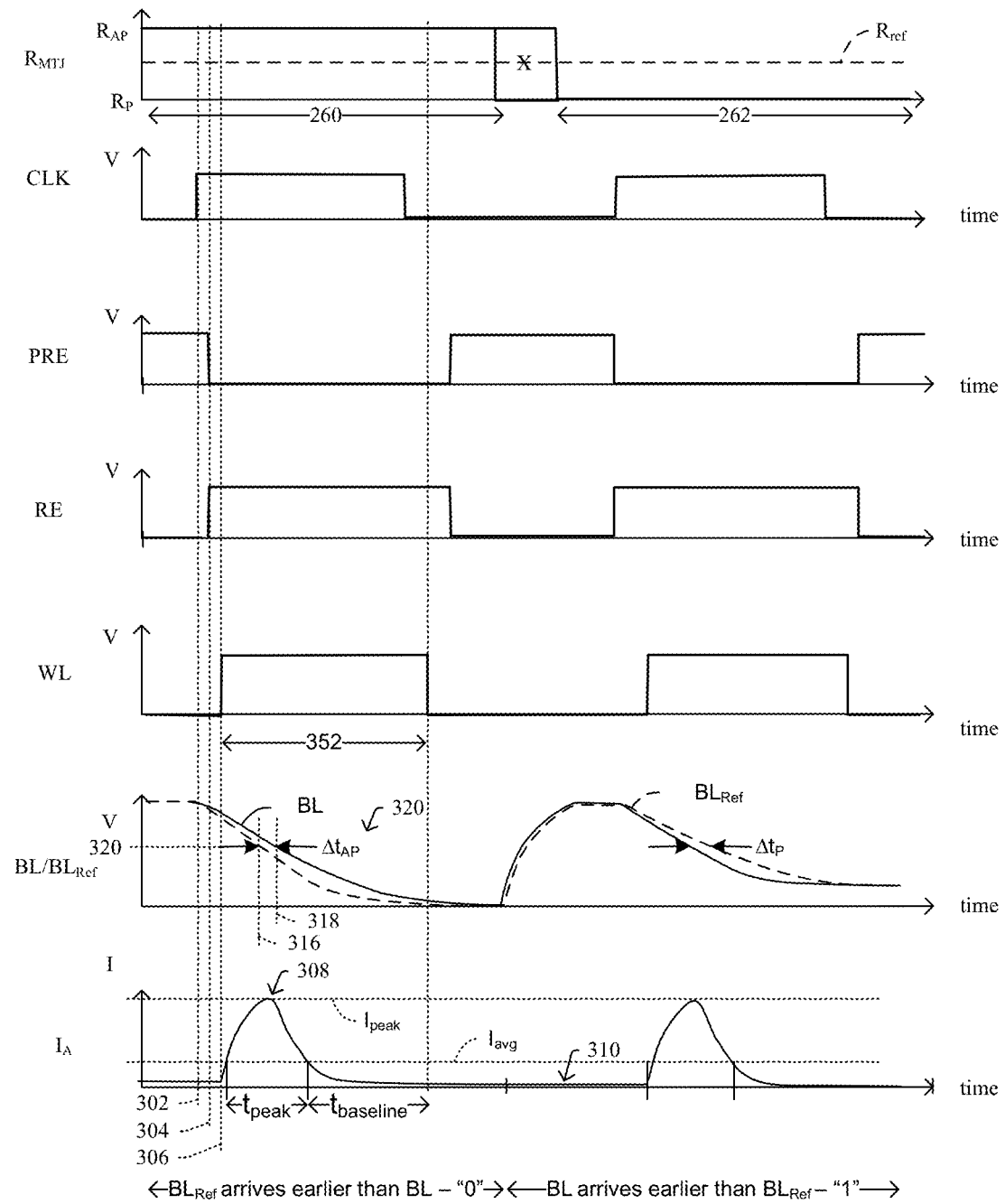
FIG. 2B illustrates a circuit schematic for some alternative embodiments of a data path that can be used in the memory device of FIG. 1.

FIG. 2B illustrates a series of timing diagrams in accordance with some embodiments. It will be appreciated that FIG. 2B's waveforms are merely a non-limiting example, and waveforms in other embodiments can vary significantly from those illustrated in FIG. 2B. Several signals are illustrated on the left-hand side of FIG. 2B—namely Resistance of an MTJ, a clock signal (CLK), pre-charge signal (PRE), a read enable signal (RE), a wordline signal (WL), a bitline signal (BL) and a bitline reference signal ($BL_{Ref}$), and an active current read signal ($I_A$). Each of these signals is plotted as a function of time, with corresponding times being vertically aligned for the various waveforms in FIG. 2B. In other embodiments, the waveforms can be individually and/or collectively flipped "upside down", for instance rather than the WL signal being active high, the WL signal could alternatively be active low.

FIG. 2B illustrates of a first read operation 260 and a second read operation 262 on FIG. 2A's data path. In the first read operation during time 260, the resistance $R_{MTJ}$ of the accessed memory cell is a high resistance state (RAP); and in the second read operation during time 262, the resistance $R_{MTJ}$ of the accessed memory cell is a low resistance state RP.

At time 302 in FIG. 2B, the clock signal has a rising edge transition from a low clock voltage to a high clock voltage.

At time 304, the pre-charge signal PRE has a falling edge transition from a high PRE voltage to a low PRE voltage. Referring to FIG. 2A, this PRE voltage transition at 304 enables first and second pre-charge transistors 210, 216, thereby pre-charging or "trickling" charge from VDD onto the active senseline 213 and reference senseline 215. Thus, the active senseline 213 and reference senseline 215 are pre-charged towards VDD at 304. More particularly, in the illustrated example, the active senseline 213 is pre-charged to VDD minus the voltage threshold of 210, and the reference senseline 215 is pre-charged to VDD minus the voltage threshold of 216.

At the same time or slightly after the PRE voltage transition at 304, the read enable signal RE has a rising edge transition from a low read enable voltage to a high read enable voltage. Referring to FIG. 2A, this RE transition enables first and second pull-up read-enable transistors 212, 218, and enables first and second pull-down read-enable transistors 214, 222. Thus, these transitions at time 304 pre-charge or "trickle" the charge from the senseline 213 and reference senseline 215 to the bitline BL and reference bitline $BL_{Ref}$, respectively. More particularly, in the illustrated example, the bitline BL is pre-charged to VDD minus the voltage threshold of 210 and minus the voltage threshold of 212, and the reference bitline $BL_{Ref}$ is pre-charged to VDD minus the voltage threshold of 216 and minus the voltage threshold of 218. The sourceline SL and reference sourceline $SL_{Ref}$ are pulled towards $V_{SS}$.

At 306, the wordline signal WL1 has a rising edge transition from a low WL voltage to a high WL voltage. Referring to FIG. 2A, this WL transition enables the access transistors 104 and 220 for Row 1; and thereby causes active read current $I_A$ to flow over the active MTJ memory element 102 and causes the reference read current $I_R$ to flow over the reference resistor 122.

As shown immediately following time 306, the assertion of the WL causes the charge previously stored on the senseline 213 to leak over the active MTJ memory element 102, resulting in a peak read current 308 in the active read current $I_A$. A similar reference read current $I_R$ (see FIG. 2A) leaks over the reference bitline $BL_{Ref}$ and over the reference resistor 122 after this WL transition.

As the active read current IA passes over the accessed MTJ memory element 102, the voltages on the active bitline BL and active senseline 213 change as a function of the data state ($R_{AP}$ or $R_P$) stored in the active MTJ memory element 102. Similarly, the voltages on the reference bitline $BL_{REF}$ and reference senseline 215 change as a function of the reference read current $I_R$ and the reference resistor 122. Because the reference resistance $R_{ref}$ falls between the two resistive states of the active MTJ memory element, the voltage levels and corresponding rising and falling edges on BL, $BL_{Ref}$ are different (see 320 in FIG. 2B). As the voltages on the BL and $BL_{Ref}$ decrease, the asynchronous, delay-sensing element 208 detects the timing difference or delay $\Delta t_{AP}$ between a first time 316 when $BL_{Ref}$ passes a predetermined BL voltage 320 and a second time 318 when BL passes the predetermined BL voltage 320. If $BL_{Ref}$ arrives earlier than BL, then a first data state (e.g., logical "0") is read from the active memory cell 100; wherease if BL arrives earlier than $BL_{Ref}$ then a second data state (e.g., logical "1") is read from the active memory cell 100. Thus, in FIG. 2B, for the first write operation during time 260, when $BL_{Ref}$ passes predetermined voltage 320 at 316 before BL passes 320 at 318, the asynchronous, delay-sensing element 208 determines a "0" data state was read; while for the second write operation during time 262, when BL passes the predetermined voltage 320 before $BL_{Ref}$, the asynchronous, delay-sensing element 208 determines a "1" data state was read. In some cases, the time delays $\Delta t_{AP}$ and $\Delta t_P$ may be equal, but in other embodiments, these time delays $\Delta t_{AP}$ and $\Delta t_P$ are different from one another. For example, in some embodiments, time delay $\Delta t_{AP}$ may range from approximately 30 picoseconds (ps) to approximately 500 ps, and $\Delta t_P$ may range from approximately 30 ps to approximately 500 ps.

Notably, the active read current $I_A$ is dynamic in that it has a peak read current at 308 that is greater than a baseline read current 310. The active read current $I_A$ has an average $I_{AVG}$ over time that falls between the peak read current 308 and the base read current 310. Under this approach, the peak read current 308 can be larger than previous approaches, which provides for larger differences between the voltages on BL and $BL_{Ref}$, but the average read current $I_{avg}$ is small enough that the overall active read current $I_A$ does not cause read disturb. In some embodiments, the peak read current 308 ranges approximately from 80 micro amps (μA) to 200 μA; and is approximately 100 μA in various embodiments. In some cases, the baseline read current 310 ranges from approximately 2 μA to approximately 20 μA; and the peak read current 308 is approximately 10 to 40 times larger than the baseline read current 310 with a duration of between 200 ps and 1 nanosecond (ns). Further, in some cases, the wordline is asserted in the high voltage state for a time 352 ranging between approximately 0.8 Volts (V) and approximately 1V; and the time when the active read current is above the average current for approximately 10%) to approximately 25% of this time 352. The $I_{avg}$ can range from approximately 20 μA to approximately 40 μA in some embodiments.

Figure 3:
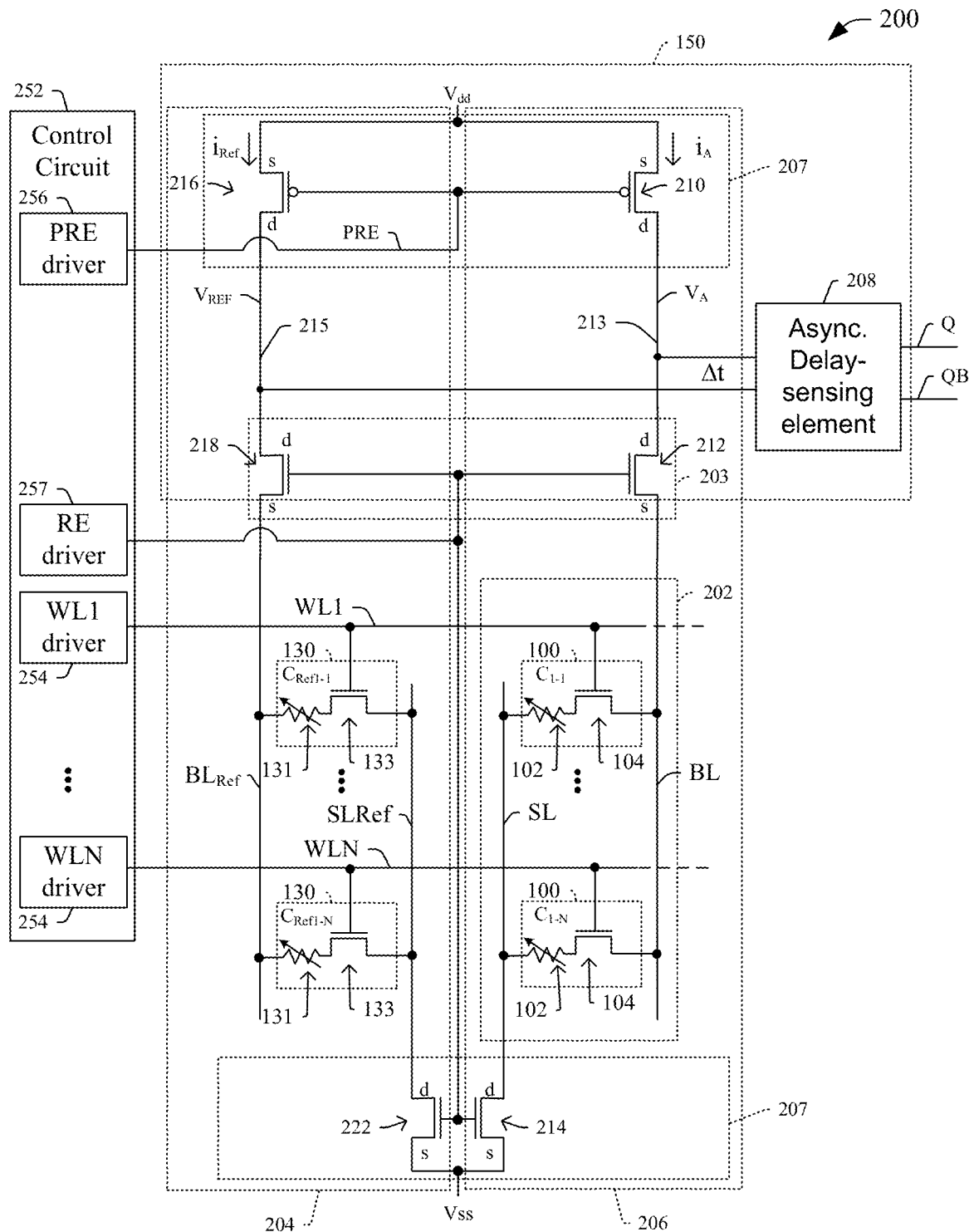
FIG. 3 illustrates a series of timing diagrams for a data path, such as illustrated in FIG. 2A, in accordance with some embodiments.

FIG. 3 illustrates a schematic view of an alternative embodiment of a data path 200. The data path 200 of FIG. 3 again includes a reference current path 204 and an active current path 206. On the active current path 206, the data path 200 includes a column 202 of active memory cells that are coupled in parallel between an active bitline (BL) and an active source line (SL). On the reference current path 204, the data path 200 also includes one or more complementary memory cells 130 coupled between a reference bitline $BL_{Ref}$ and a reference sourceline $SL_{Ref}$. Each complementary memory cell 130 includes an MTJ memory element 131 and an access transistor 133. Whereas the reference memory cell of FIG. 2A's embodiment included a reference resistance, the MTJ memory element 131 of each complementary memory cell 130 can be identical to the MTJ structure of the MTJ memory element 102 in the memory cells 100. Each complementary memory cell of a row stores a complementary (i.e., opposite) data state as the active memory cell of that row. Thus, for example, if active MTJ memory cell $C_{1-1}$ stores a high resistance state (e.g., $R_{AP}$ representing a logical "1" data state), the complementary MTJ $C_{Ref1-1}$ stores a low resistance state (e.g., $R_P$ representing a "0" data state).

Figure 4:
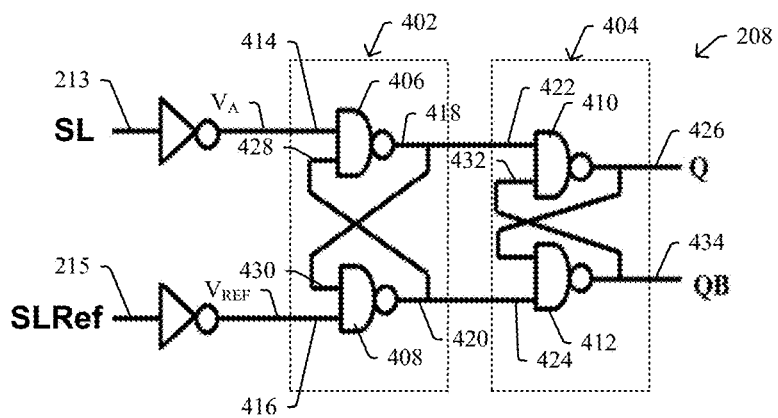
FIG. 4 illustrates a circuit schematic for some embodiments of a delay-sensing circuit in accordance with the disclosure.

FIG. 4 illustrates some embodiments of the asynchronous, delay-sensing element 208. In FIG. 4, the asynchronous, delay-sensing element 208 includes a first pair of cross-coupled logic gates 402 having a first input 414 coupled to the active senseline and a second input 416 coupled to the reference senseline, and having a first output 418 and a second output 420. A second pair of cross-coupled logic gates 404 is downstream of the first pair of cross-coupled logic gates. The second pair of cross-coupled logic gates 404 has a third input 422 coupled to the first output 418 of the first pair of cross-coupled logic gates 402. The second pair of cross-coupled logic gates 404 also has a fourth input 424 coupled to the second output 420 of the first pair of cross-coupled logic gates 402, and a third output 426 on which a data state Q read from the accessed MTJ element, and a fourth output 434 on which complementary data state QB is provided, wherein QB is opposite Q.

In some embodiments, the cross-coupled logic gates include NAND gates. A first NAND gate 406 has a first input 414 coupled to the active senseline, a second input 428 coupled to a second NAND gate output, and a first output 418. A second NAND gate 408 has a first input 414 coupled to the reference senseline $SL_{Ref}$ and a second input 430 coupled to the first output 418, and the second output 420. A third NAND gate 410 has a third input 422 coupled to the first output 418, a second input 432 coupled to a fourth output 434, and a third output 426 on which a data state read from the accessed MTJ element is provided. A fourth NAND gate 412 has a first input 424 coupled to the second output 420, a second input coupled to the third output 426, and the fourth output 434 on which a complementary data state QB read from the MTJ is provided.

Figure 5:
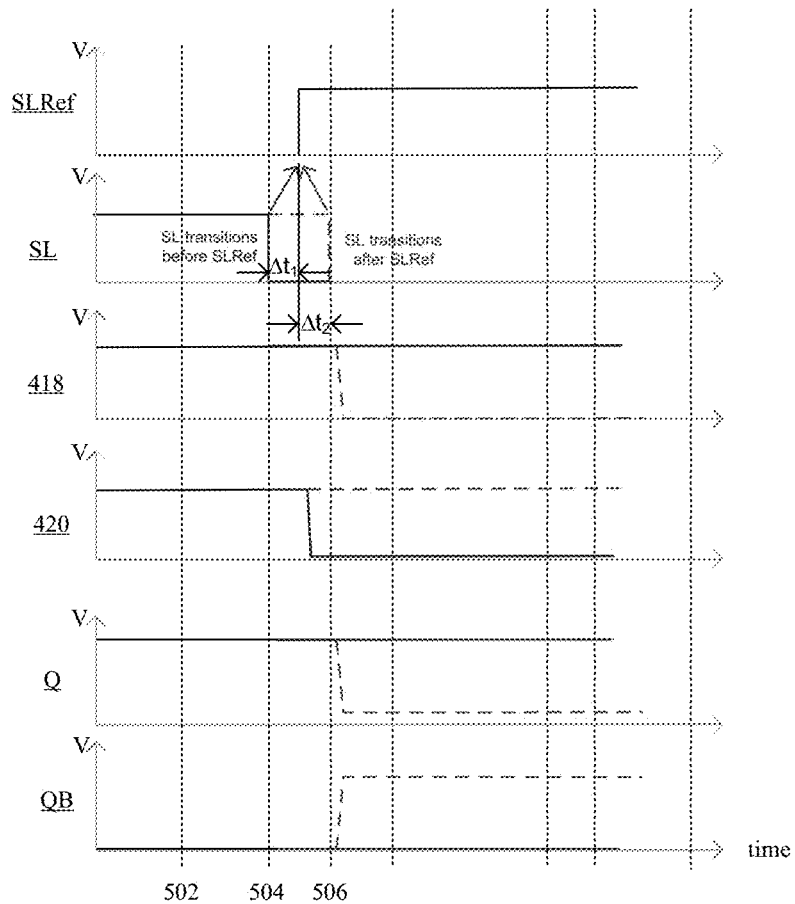
FIG. 5 illustrates a series of timing diagrams for a delay sensing circuit, such as illustrated in FIG. 4, in accordance with some embodiments.

FIG. 5 illustrates a series of timing diagrams in accordance with two read operations in some embodiments of FIG. 4's asynchronous, delay-sensing element. It will be appreciated that FIG. 5's waveforms are merely a non-limiting example, and waveforms in other embodiments can vary significantly from those illustrated in FIG. 5. Several signals are illustrated on the left-hand side of FIG. 5—reference senseline voltage ($SL_{Ref}$), active senseline voltage (SL), At time 502, voltage on $SL_{Ref}$ is low, voltage on senseline is high, voltage on output 418 is high, voltage on second output 420 is high, voltage output Q is high, and voltage output QB is low.

In time 504, an example waveform is shown where the SL transitions before the $SL_{Ref}$ by a timing delay $\Delta t_1$. In this example, this SL transition leaves output 418 in a high voltage state, and transitions second output 420 to a low voltage state. Thus, carrying these voltage states through the NAND gates of FIG. 4, this transition results in a high voltage being applied to output 426, such that Q is determined to be in a "1" state for this transition.

On the other hand, at 506, if the SL transitions after SL$_{Ref}$ by a timing delay, Δt$_2$, the read data state is different. In this example, this delayed SL transition transitions the output 418 to a low voltage state, while second output 420 remains in a high voltage state. Thus, carrying these voltage states through the NAND gates of FIG. 4, this delayed transition results in a low voltage being applied to output 426, such that Q is determined to be in a "0" state for this transition.

Thus, if SL$_{Ref}$ arrives earlier than SL, then a first data state (e.g., logical "1") is read in FIG. 5's example; whereas if BL arrives earlier than BL$_{Ref}$ then a second data state (e.g., logical "0") is read in FIG. 5's example. Thus, by making use of a timing delay difference between a first rising or falling edge of a voltage signal from the MTJ and a second rising or falling edge of a voltage signal from the reference MTJ, this approach enables more robust sensing than previous approaches.

Figure 6:
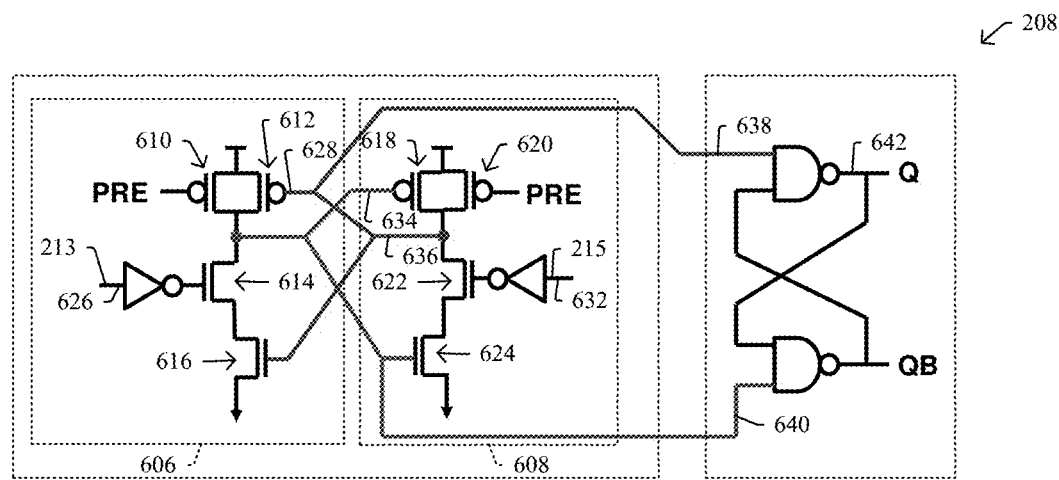
FIG. 6 illustrates a circuit schematic for still other embodiments of a delay-sensing circuit in accordance with the disclosure.

FIG. 6 illustrates an alternative embodiment for an asynchronous, delay-sensing element 208. This asynchronous, delay-sensing element 208 includes a first stage 602 and a second stage 604. The first stage 602 includes a first current path 606 and a second current path 608. The first current path 606 includes first and second PMOS transistors 610, 612, and first and second NMOS transistors 614, 616, while the second current path 608 includes third and fourth PMOS transistors 618, 620, and third and fourth NMOS transistors 622, 624. Thus, the first stage 602 includes a first input 626, a second input 628, and a first output 630. The first input 626 is coupled to the senseline 213 of the active current path. The second current path 608 includes a third input 632, a fourth input 634, and a second output 636. The third input 632 is coupled to the reference senseline 215 of the reference current path, the second input 628 is coupled to the second output 636, and the fourth input 634 is coupled to the first output 630. The second stage 604, which includes cross-coupled logic gates such as NAND gates for example, includes a fifth input 638 coupled to the second output 636, a sixth input 640 coupled to the first output 630, and a third output 632 on which the determined data state Q is provided.

Figure 7A:
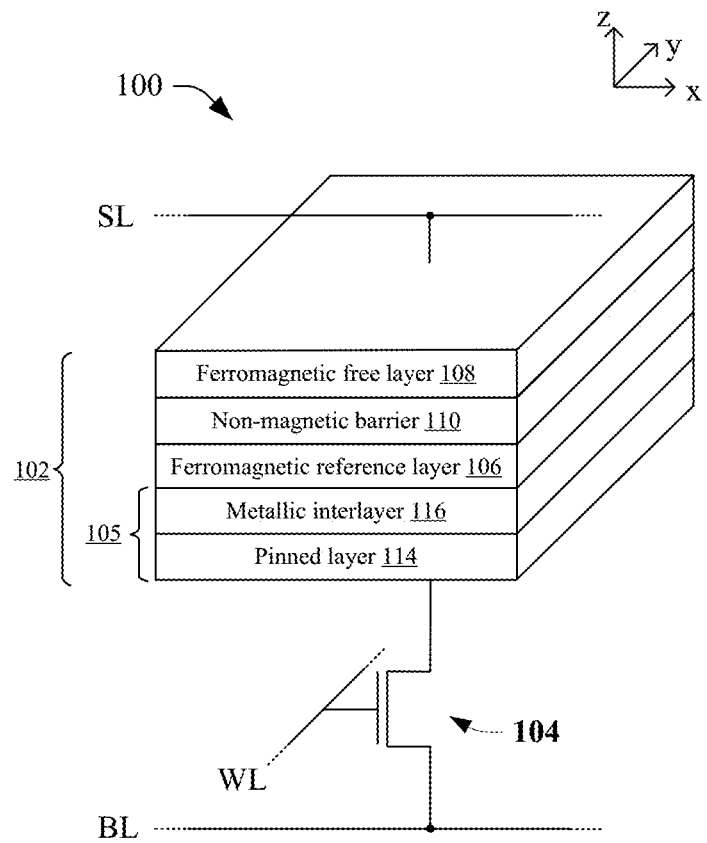
FIG. 7A illustrates a three dimensional view of some embodiments of an MTJ memory cell.

FIG. 7A illustrates some embodiments of a memory cell 100 that can be used with various read techniques as provided herein. The memory cell 100 includes a magnetic tunnel junction (MTJ) memory element 102 and an access transistor 104. A source-line (SL) is coupled to one end of the MTJ memory element 102, and a bit-line (BL) is coupled to an opposite end of the MTJ memory element through the access transistor 104. Thus, application of a suitable word-line (WL) voltage to a gate electrode of the access transistor 104 couples the MTJ memory element 102 between the BL and the SL, and allows a bias to be applied over the MTJ memory element 102 through the BL and the SL. Consequently, by providing suitable bias conditions, the MTJ memory element 102 can be switched between two states of electrical resistance, a first state with a low resistance (magnetization directions of reference layer and free layer are parallel) and a second state with a high resistance (magnetization directions of reference layer and free layer are anti-parallel), to store data. It is noted that in some embodiments, such as those described above, the MTJs can have a positive tunneling magnetoresistance (TMR)—meaning there is a higher resistance for anti-parallel orientation and lower resistance for parallel orientation; however, in other embodiments the MTJs can have a negative TMR—meaning there is a lower resistance for anti-parallel orientation and higher resistance for parallel orientation.

The MTJ memory element 102 includes a pinned structure 105, a ferromagnetic reference layer 106 over the pinned structure 105, and a ferromagnetic free layer 108 over the ferromagnetic reference layer 106. A non-magnetic barrier layer 110 separates the ferromagnetic reference layer 106 from the ferromagnetic free layer 108. Although this disclosure is described largely in terms of MTJs, it is also to be appreciated that it is applicable to spin valve memory elements, which may use a magnetically soft layer as the ferromagnetic free layer 108, and a magnetically hard layer as the ferromagnetic reference layer 106, and a non-magnetic barrier separating the magnetically hard layer and magnetically soft layer.

In some embodiments, the pinned structure 105 is a multi-layer structure that includes a pinned layer 114 and a thin metallic interlayer 116 over the pinned layer 114. The magnetization direction of the pinned layer 114 is constrained or "fixed". In some embodiments, the pinned layer 114 comprises CoFeB, and the metallic interlayer 116 comprises ruthenium (Ru). The metallic interlayer 116 has a predetermined thickness, which introduces a strong anti-parallel coupling between the pinned layer 114 and the ferromagnetic reference layer 106. For example, in some embodiments where the metallic interlayer 116 is a transition metal, a transition metal alloy, or even an oxide to provide strong anti-ferromagnetic interlayer-exchange coupling (IEC), the metallic interlayer 116 has a thickness ranging from 1.2 angstroms to approximately 30 angstroms. In some embodiments, the metallic interlayer 116 is a ruthenium (Ru) layer or iridium (Ir) layer.

The ferromagnetic reference layer 106 has a magnetization direction that is "fixed". In some embodiments, the ferromagnetic reference layer 106 is a CoFeB layer. The magnetic moment of the ferromagnetic reference layer 106 is opposite to that of the pinned layer 114. For example, in the example of FIG. 1, the magnetization direction of the pinned layer 114 can point upwards along the z axis, and the magnetization direction of the ferromagnetic reference layer 106 can point downwards along the z axis, although in other embodiments these magnetic directions could be "flipped" so the pinned layer 114 points downward and the ferromagnetic reference layer 106 points upwards. The magnetization directions can also be in-plane (e.g., pointing in the x and/or y directions), rather than up-down depending on the implementation. Also, the entire MTJ structure can be fabricated upside down. Hence, in this alternative case, the SL is nearer the ferromagnetic reference layer 106 and the BL is nearer the ferromagnetic free layer 108.

In some embodiments, the non-magnetic barrier layer 110 can comprise an amorphous barrier, such as aluminum oxide (AlO$_x$) or titanium oxide (TiO$_x$); or a crystalline barrier, such as manganese oxide (MgO) or spinel (MgAl$_2$O$_4$, also known as "MAO" in some contexts). In embodiments, the non-magnetic barrier layer 110 is a tunnel barrier which is thin enough to allow quantum mechanical tunneling of current between the ferromagnetic free layer 108 and ferromagnetic reference layer 106. In alternative embodiments where the MTJ is replaced with a spin valve, the non-magnetic barrier layer 110 is typically a non-magnetic metal. Examples of non-magnetic metals include, but are not limited to: copper, gold, silver, aluminum, lead, tin, titanium and zinc; and/or alloys such as brass and bronze.

The ferromagnetic free layer 108 is capable of changing its magnetization direction between one of two magnetization states, which have different resistances and which correspond to binary data states stored in the memory cell. In some embodiments, the ferromagnetic free layer 108 can comprise a magnetic metal, such as iron, nickel, cobalt and alloys thereof, for example. For instance, in some embodiments, the ferromagnetic free layer 108 can comprise cobalt, iron, and boron, such as a CoFeB ferromagnetic free layer; and the non-magnetic barrier layer 110 can comprise an amorphous barrier, such as aluminum oxide ($AlO_x$) or titanium oxide ($TiO_x$), or a crystalline barrier, such as manganese oxide (MgO) or spinel ($MgAl_2O_4$).

For example, in a first state, the ferromagnetic free layer 108 can have a first magnetization direction in which the magnetization of the ferromagnetic free layer 108 is aligned in parallel with the magnetization direction of the ferromagnetic reference layer 106, thereby providing the MTJ memory element 102 with a relatively low resistance. In a second state, the ferromagnetic free layer 108 can have a first magnetization is aligned anti-parallel with the magnetization direction of the ferromagnetic reference layer 106, thereby providing the MTJ memory element 102 with a relatively high resistance.

Figure 7B:
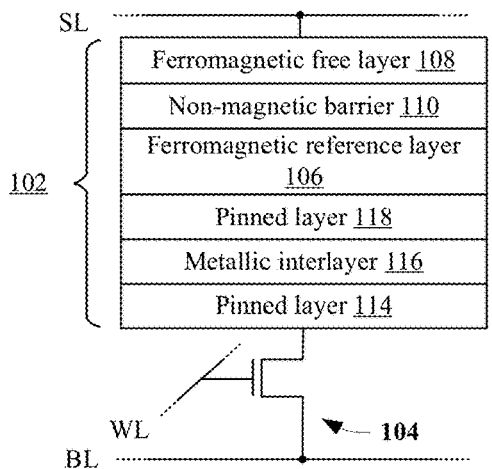
FIGS. 7B-7G illustrate some alternative embodiments for an MTJ memory cell.

FIG. 7B illustrates a case where layer 118 and pinned layer 114 are anti-ferromagnetically coupled, such that layer 118 and pinned layer 114 collectively form a synthetic anti-ferromagnet (SAF). This coupling is due to metallic interlayer 116, which can be a transition metal, such as Ruthenium or Iridium.

Figure 7C:
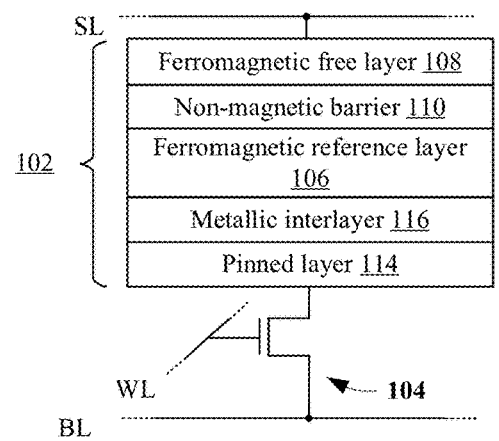

In FIG. 7C, which corresponds to a case of FIG. 1A without an anti-ferromagnetic layer present, ferromagnetic reference layer 106 and pinned layer 114 are anti-ferromagnetically coupled, such that ferromagnetic reference layer 106 and pinned layer 114 collectively form a synthetic anti-ferromagnet (SAF). This coupling is due to metallic interlayer 116, which can be a transition metal, such as Ruthenium or Iridium. Here, ferromagnetic reference layer 106 is actually a composite layer, and in itself is graded or multi-layered. Its top region in vicinity of insulator servers as a reference layer, while layer region in vicinity of metallic interlayer 116 serves as pinning layer.

Figure 7D:
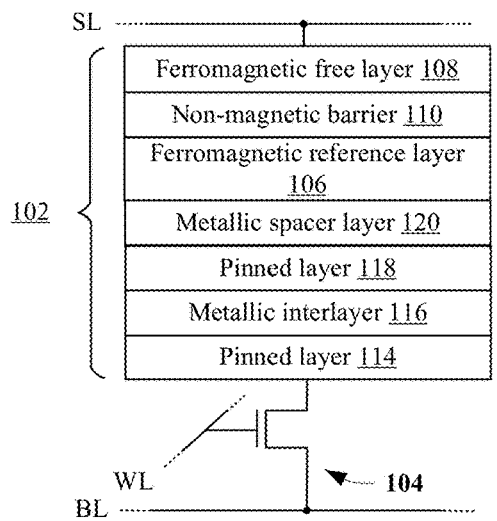

FIG. 7D is an alternate representation of FIG. 7B. It additionally illustrates a metallic spacer between ferromagnetic reference layer 106 and layer 118. The role of this metallic spacer is to draw away boron from ferromagnetic reference layer 106 during annealing. Spacer metallic layer 120 can be a transition metal, such as Ta, Hf, Mo, W or their alloys with CoFeB. One can say that in FIG. 7C ferromagnetic reference layer 106 subsumes ferromagnetic reference layer 106, spacer metallic layer 120, and layer 118 of FIG. 1D; or it subsumes ferromagnetic reference layer 106 and layer 118 of FIG. 7B.

Figure 7E:
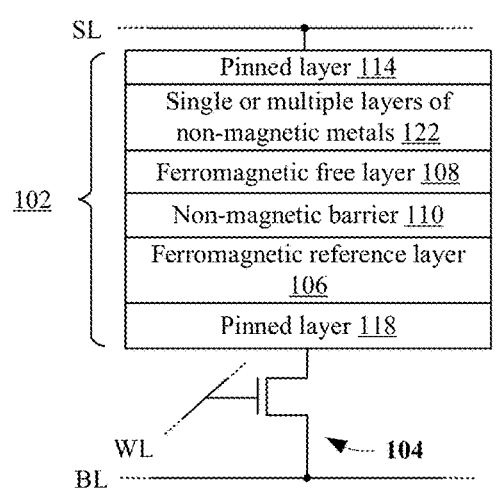

FIG. 7E illustrated an example where ferromagnetic reference layer 106 and layer 118 may or may not form a composite layer, yet are illustrated separately. In such cases, the pinned layer is deposited on the top side instead of the bottom side. The magnetization direction of pinned layer 114 is opposite of that of ferromagnetic reference layer 106 and layer 118. Ferromagnetic reference layer 106 and layer 118 have the same direction.

Figure 7F:
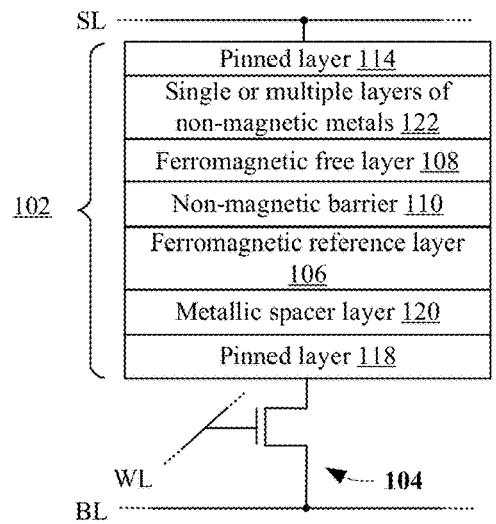

FIG. 7F is an alternate representation of FIG. 7E with explicit illustration of the spacer metallic layer 120.

Figure 7G:
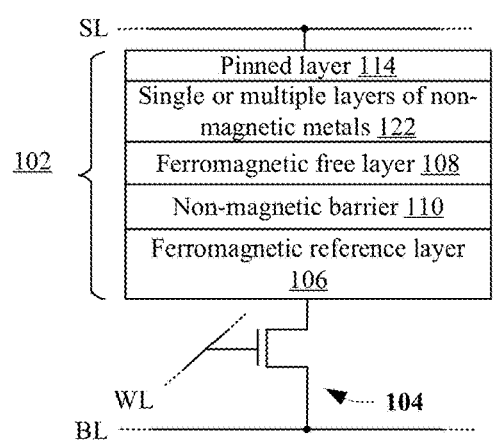

FIG. 7G is an alternate representation of FIG. 7F where ferromagnetic reference layer 106 subsumes ferromagnetic reference layer 106, spacer metallic layer 120, and layer 118, as it did in FIG. 7A.

Figure 8:
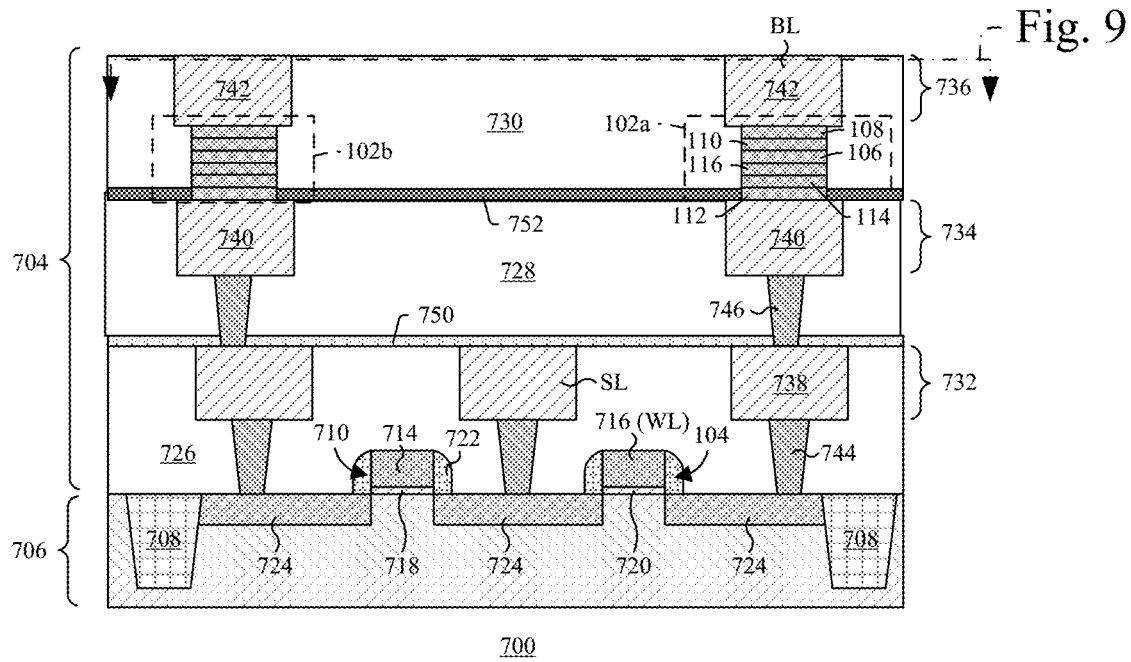
FIG. 8 illustrates a cross-sectional diagram illustrating some embodiments of a memory device that includes an MTJ memory element.

FIG. 8 illustrates a cross sectional view of some embodiments of an integrated circuit 700, which includes MTJ memory elements 102a, 102b disposed in an interconnect structure 704 of the integrated circuit 700. The integrated circuit 700 includes a semiconductor substrate 706. The substrate 706 may be, for example, a bulk substrate (e.g., a bulk silicon substrate) or a silicon-on-insulator (SOI) substrate. The illustrated embodiment depicts one or more shallow trench isolation (STI) regions 708, which may include a dielectric-filled trench within the substrate 706.

Two access transistors 710, 712 are disposed between the STI regions 708. The access transistors 710, 104 include access gate electrodes 714, 716, respectively; access gate dielectrics 718, 720, respectively; access sidewall spacers 722; and source/drain regions 724. The source/drain regions 724 are disposed within the substrate 706 between the access gate electrodes 714, 716 and the STI regions 708, and are doped to have a first conductivity type which is opposite a second conductivity type of a channel region under the gate dielectrics 718, 720, respectively. The word line gate electrodes 714, 716 may be, for example, doped polysilicon or a metal, such as aluminum, copper, or combinations thereof. The word line gate dielectrics 718, 720 may be, for example, an oxide, such as silicon dioxide, or a high-κ dielectric material. The word line sidewall spacers 722 can be made of silicon nitride (e.g., $Si_3N_4$), for example.

The interconnect structure 704 is arranged over the substrate 706 and couples devices (e.g., transistor 710, and access transsistor 104) to one another. The interconnect structure 704 includes a plurality of IMD layers 726, 728, 730, and a plurality of metallization layers 732, 734, 736 which are layered over one another in alternating fashion. The IMD layers 726, 728, 730 may be made, for example, of a low κ dielectric, such as un-doped silicate glass, or an oxide, such as silicon dioxide, or an extreme low κ dielectric layer. The metallization layers 732, 734, 736 include metal lines 738, 740, 742, which are formed within trenches, and which may be made of a metal, such as copper or aluminum. Contacts 744 extend from the bottom metallization layer 732 to the source/drain regions 724 and/or gate electrodes 714, 104; and vias 746 extend between the metallization layers 732, 734, 736. The contacts 744 and the vias 746 extend through dielectric-protection layers 750, 752 (which can be made of dielectric material and can act as etch stop layers during manufacturing). The dielectric-protection layers 750, 752 may be made of an extreme low-κ dielectric material, such as SiC, for example. The contacts 744 and the vias 746 may be made of a metal, such as copper or tungsten, for example.

MTJ memory elements 102a, 102b, which are configured to store respective data states, are arranged within the interconnect structure 704 between neighboring metal layers. The MTJ memory element 102a includes an MTJ, including an anti-ferromagnetic layer 112, pinned layer 114, metallic interlayer 116, ferromagnetic reference layer 106, non-magnetic barrier layer 110, and ferromagnetic free layer 108.

Figure 9:
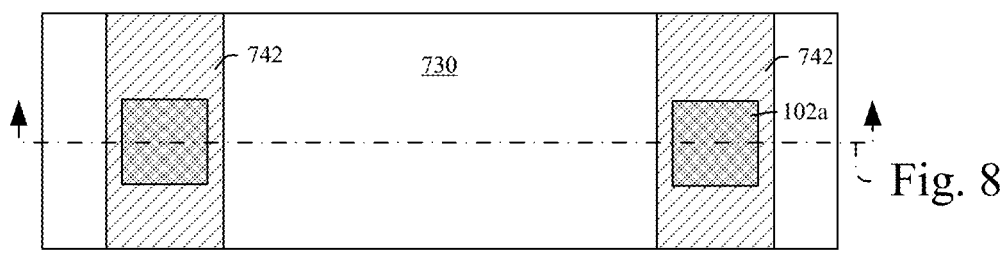
FIG. 9 illustrates a top view of the memory device of FIG. 8, as indicated by the cut-lines in FIG. 8.

FIG. 9 depicts some embodiments of a top view of FIG. 8's integrated circuit 700 as indicated in the cut-away lines shown in FIGS. 8-9. As can be seen, the MTJ memory elements 102a, 102b can have a square/rectangular or circular/elliptical shape when viewed from above in some embodiments. In other embodiments, however, for example due to practicalities of many etch processes, the corners of the illustrated square shape can become rounded, resulting in MTJ memory elements 102a, 102b having a square shape with rounded corners, or having a circular shape. The MTJ memory elements 102a, 102b are arranged over metal lines 740, respectively, and have upper portions in direct electrical connection with the metal lines 742, respectively, without vias or contacts there between in some embodiments. In other embodiments, vias or contacts couple the upper portion to the metal lines 742.

Some embodiments of the present disclosure relate to a memory device. The memory device includes an active current path including a magnetic tunnel junction (MTJ); and a reference current path including a reference resistance element. The reference resistance element has a resistance that differs from a resistance of the MTJ. An asynchronous, delay-sensing element has a first input coupled to the active current path and a second input coupled to the reference current path. The asynchronous, delay-sensing element is configured to sense a timing delay between a first rising or falling edge voltage on the active current path and a second rising or falling edge voltage on the reference current path. The asynchronous, delay-sensing element is further configured to determine a data state stored in the MTJ based on the timing delay.

Other embodiments relate to a memory device including a memory array with a plurality of memory cells arranged in rows and columns over a semiconductor substrate. The plurality of memory cells includes a plurality of magnetic tunnel junctions (MTJs), respectively, and a plurality of access transistors, respectively. A plurality of wordlines extend generally in parallel with the rows, wherein a wordline is coupled to multiple gate electrodes of multiple access transistors, respectively, along the row. A plurality of bitlines extends generally in parallel with the columns, wherein a bitline is coupled to multiple source/drain regions of multiple access transistors, respectively, along a column, and is configured to provide an active data signal based on a data state of an MTJ of the row when the wordline is asserted. A complementary or reference bitline extends generally in parallel with the column and is configured to provide a complementary or reference data signal when the wordline is asserted. The complementary or reference data signal has a rising or falling edge that differs from a corresponding rising or falling edge of the data signal by different timing delays depending on whether the data state is a high resistance state or a low resistance state. An asynchronous, delay-sensing element has a first input coupled to the bitline and a second input coupled to the complementary or reference bitline.

Still other embodiments relate to a memory device including an active current path including a magnetic tunnel junction (MTJ). The MTJ has a ferromagnetic layer coupled to a source line, and a pinned layer coupled to a data storage node. A first access transistor is disposed on the active current path. The first access transistor has a first source/drain region coupled to the data storage node, a second source/drain region coupled to an active bitline, and a first gate coupled to a wordline. A reference current path includes a reference MTJ element having a reference resistance. A second access transistor is disposed on the reference current path. The second access transistor has a third source/drain region coupled to the reference MTJ element, a fourth source/drain region coupled to a reference bitline, and a second gate coupled to the wordline. A sense amplifier includes an asynchronous, delay-sensing element having a first input coupled to the active bitline and a second input coupled to the reference bitline.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
an active current path including a magnetic tunnel junction (MTJ);
a reference current path including a reference resistance element, the reference resistance element having a resistance that differs from a resistance of the MTJ; and
an asynchronous, delay-sensing element having a first input coupled to the active current path and a second input coupled to the reference current path, wherein the asynchronous, delay-sensing element is configured to sense a timing delay between a first rising or falling edge voltage on the active current path and a second rising or falling edge voltage on the reference current path, the asynchronous, delay-sensing element further configured to determine a data state stored in the MTJ based on the timing delay.

2. The memory device of claim 1:
wherein the asynchronous, delay-sensing element is configured to determine the data state is a first data state if a predetermined voltage on the active current path arrives before the predetermined voltage arrives on the reference current path; and
wherein the asynchronous, delay-sensing element is further configured to determine the data state is a second data state if the predetermined voltage on the active current path arrives after the predetermined voltage arrives on the reference current path, the second data state being opposite the first data state.

3. The memory device of claim 1, wherein the reference resistance element has a fixed resistance that is an average of a first resistance corresponding to a first data state of the MTJ and a second resistance corresponding to a second data state of the MTJ, the second data state being opposite the first data state.

4. The memory device of claim 1, wherein the asynchronous, delay-sensing element comprises:
a first pair of cross-coupled logic gates having a first input coupled to the active current path and a second input coupled to the reference current path, and having a first output and a second output; and
a second pair of cross-coupled logic gates downstream of the first pair of cross-coupled logic gates, the second pair of cross-coupled logic gates having a third input coupled to the first output of the first pair of cross-coupled logic gates, a fourth input coupled to the second output of the first pair of cross-coupled logic gates, and a third output on which the determined data state is provided.

5. The memory device of claim 1, wherein the asynchronous, delay-sensing element comprises:
a first stage including a first current path and a second current path, the first current path including a first input, a second input, and a first output, the first input being coupled to the active current path; and the second current path including a third input, a fourth input, and a second output, the third input being coupled to the reference current path, the second input being coupled to the second output, and the fourth input being coupled to the first output; and a second stage including a fifth input coupled to the second output, a sixth input coupled to the first output, and a third output on which the determined data state is provided.

6. The memory device of claim 1, wherein the active current path is configured to carry a read current during a read operation, the read current increasing from a baseline current to a peak current based on assertion of a wordline voltage, the peak current ranging between 80 µA and 200 µA.

7. The memory device of claim 1, wherein the MTJ is included in a memory array including a plurality of memory cells arranged in rows and columns over a semiconductor substrate, wherein the plurality of memory cells include a plurality of magnetic tunnel junctions (MTJs), respectively, and a plurality of access transistors, respectively; further comprising:
   a plurality of wordlines extending generally in parallel with the rows, wherein a wordline is coupled to multiple gate electrodes of multiple access transistors, respectively, along a row and the MTJ is in the row;
   a plurality of bitlines extending generally in parallel with the columns, wherein a bitline is coupled to multiple source/drain regions of multiple access transistors, respectively, along a column, and is configured to provide an active data signal based on a data state of the MTJ of the row when the wordline is asserted;
   a complementary or reference bitline extending generally in parallel with the column and configured to provide a complementary or reference data signal when the wordline is asserted; and
   wherein first input of the asynchronous, delay-sensing element is coupled to the bitline and the second input of the asynchronous, delay-sensing element is coupled to the complementary or reference bitline.

8. The memory device of claim 7, wherein the asynchronous, delay-sensing element is configured to sense the timing delay between a first rising or falling edge voltage on the bitline and a second rising or falling edge voltage on the complementary or reference bitline, the asynchronous, delay-sensing element further configured to determine the data state of the MTJ based on the timing delay.

9. The memory device of claim 7, wherein the asynchronous, delay-sensing element is configured to determine the data state of the MTJ is a first bit value when a first rising or falling edge voltage on the bitline passes a predetermined voltage before the predetermined voltage arrives on the complementary or reference bitline for a read operation; and
   wherein the asynchronous, delay-sensing element is configured to determine the data state of the MTJ is a second bit value when the first rising or falling edge voltage on the bitline passes the predetermined voltage after the predetermined voltage arrives on the complementary or reference bitline for the read operation, the second bit value being opposite the first bit value.

10. The memory device of claim 7, wherein the asynchronous, delay-sensing element comprises:
    a first pair of cross-coupled logic gates having a first input coupled to the bitline and a second input coupled to the complementary or reference bitline, and having a first output and a second output; and
    a second pair of cross-coupled logic gates downstream of the first pair of cross-coupled logic gates, wherein the second pair of cross-coupled logic gates have a third input coupled to the first output of the first pair of cross-coupled logic gates, a fourth input coupled to the second output of the first pair of cross-coupled logic gates, and a third output on which a data state read from the MTJ is provided.

11. The memory device of claim 7, wherein the asynchronous, delay-sensing element comprises:
    a first NAND gate having a first first NAND gate input coupled to the bitline, a second first NAND gate input coupled to a second NAND gate output, and a first NAND gate output;
    a second NAND gate having a first second NAND gate input coupled to the first NAND gate output, a second second NAND gate input coupled to the complementary or reference bitline, and the second NAND gate output;
    a third NAND gate having a first third NAND gate input coupled to the first NAND gate output, a second third NAND gate input coupled to a fourth NAND gate output, and a third NAND gate output on which a data state read from the MTJ is provided; and
    a fourth NAND gate having a first fourth NAND gate input coupled to the third NAND gate output, a second fourth NAND gate input coupled to the second NAND gate output, and the fourth NAND gate output on which a complementary data state read from the MTJ is provided.

12. The memory device of claim 7, wherein the bitline is configured to carry a read current during a read operation, the read current increasing from a baseline current to a peak current based on assertion of a wordline voltage, the peak current being at least twice as large as the baseline current but the peak current being present for no more than 50% of a time for which the wordline voltage is asserted during the read operation.

13. The memory device of claim 7, wherein the MTJ comprises:
    a ferromagnetic pinned layer corresponding to a first end of the MTJ, the ferromagnetic pinned layer coupled to the bitline;
    a ferromagnetic free layer corresponding to a second end of the MTJ opposite the first end; and
    a non-magnetic, dielectric barrier layer separating the ferromagnetic pinned layer from the ferromagnetic free layer.

14. The memory device of claim 1, wherein the MTJ has a ferromagnetic layer coupled to a source line, and a pinned layer coupled to a data storage node, and wherein the reference resistance element on the reference current path includes a reference MTJ element; the memory device further comprising:
    a first access transistor disposed on the active current path, the first access transistor having a first source/drain region coupled to the data storage node, a second source/drain region coupled to an active bitline, and a first gate coupled to a wordline;
    a second access transistor disposed on the reference current path, the second access transistor having a third source/drain region coupled to the reference MTJ element, a fourth source/drain region coupled to a reference bitline, and a second gate coupled to the wordline; and
    wherein the asynchronous, delay-sensing element is included in a sense amplifier, the asynchronous, delay-sensing element having a first input coupled to the active bitline and a second input coupled to the reference bitline.

15. The memory device of claim 14, wherein the sense amplifier is configured to induce a read current over the active bitline during a time in which the wordline enables the first access transistor for a read operation, the read current increasing from a baseline current to a peak current based on assertion of a wordline voltage to the wordline during the read operation, the peak current being at least twice as large as the baseline current and the peak current being present between 10% and 25% of the time for which the wordline voltage enables the first access transistor during the read operation.

16. The memory device of claim 14, wherein the asynchronous, delay-sensing element comprises:
a first stage including a first input coupled to the active current path and a second input coupled to the reference current path;
a second stage including a third input coupled to a first output of the first stage, a fourth input coupled to a second output of the first stage, and a third output; and
wherein the asynchronous, delay-sensing element is configured to output a voltage representative of a data state read from the MTJ on the third output of the second stage.

17. The memory device of claim 14, wherein the asynchronous, delay-sensing element comprises:
a first stage including a first current path and a second current path, the first current path including a first input, a second input, and a first output, the first input being coupled to the active current path; and the second current path including a third input, a fourth input, and a second output, the third input being coupled to the reference current path, the second input being coupled to the second output, and the fourth input being coupled to the first output; and
a second stage including a fifth input coupled to the second output, a sixth input coupled to the first output, and a third output on which a data state read from the MTJ is provided.

18. The memory device of claim 14, wherein the active current path is configured to carry a read current during a read operation, the read current increasing from a baseline current to a peak current based on assertion of a wordline voltage, the peak current ranging between 80 μA and 200 μA.

19. A memory device, comprising:
an active current path including a magnetic tunnel junction (MTJ);
a reference current path including a reference resistance element, the reference resistance element having a resistance that differs from a resistance of the MTJ; and
an asynchronous, delay-sensing element having a first input coupled to the active current path and a second input coupled to the reference current path, wherein the asynchronous, delay-sensing element is configured to sense a timing delay between a first rising or falling edge voltage on the active current path and a second rising or falling edge voltage on the reference current path, the asynchronous, delay-sensing element further configured to determine a data state stored in the MTJ based on the timing delay;
wherein the asynchronous, delay-sensing element comprises:
a first stage including a first input coupled to the active current path and a second input coupled to the reference current path; and
a second stage including a third input coupled to a first output of the first stage, and a fourth input coupled to a second output of the first stage.

20. A memory device, comprising:
an active current path including a magnetic tunnel junction (MTJ);
a reference current path including a reference resistance element, the reference resistance element having a resistance that differs from a resistance of the MTJ; and
an asynchronous, delay-sensing element having a first input coupled to the active current path and a second input coupled to the reference current path, wherein the asynchronous, delay-sensing element is configured to sense a timing delay between a first rising or falling edge voltage on the active current path and a second rising or falling edge voltage on the reference current path, the asynchronous, delay-sensing element further configured to determine a data state stored in the MTJ based on the timing delay;
wherein the asynchronous, delay-sensing element comprises:
a first NAND gate having a first first NAND gate input coupled to the active current path, a second first NAND gate input coupled to a second NAND gate output, and a first NAND gate output;
a second NAND gate having a first second NAND gate input coupled to the first NAND gate output, a second second NAND gate input coupled to the reference current path, and the second NAND gate output;
a third NAND gate having a first third NAND gate input coupled to the first NAND gate output, a second third NAND gate input coupled to a fourth NAND gate output, and a third NAND gate output on which the determined data state is provided; and
a fourth NAND gate having a first fourth NAND gate input coupled to the third NAND gate output, a second fourth NAND gate input coupled to the second NAND gate output, and the fourth NAND gate output on which a complementary data state, which is opposite the determined data state, is provided.

* * * * *